United States Patent

Tanaka et al.

Patent Number: 6,149,162
Date of Patent: Nov. 21, 2000

[54] SLIDING MEMBER

[75] Inventors: Shoji Tanaka, Shiojiri; Naoki Ito, Okaya, both of Japan

[73] Assignee: Teikoku Pistong Ring Co., Ltd., Tokyo, Japan

[21] Appl. No.: 09/217,199

[22] Filed: Dec. 22, 1998

[30] Foreign Application Priority Data

Dec. 24, 1997 [JP] Japan .................................. 9-366438

[51] Int. Cl.$^7$ ...................................................... F16J 9/26
[52] U.S. Cl. ........................... 277/443; 277/444; 277/440
[58] Field of Search ..................................... 277/440, 442, 277/443, 444

[56] References Cited

U.S. PATENT DOCUMENTS

| | | | |
|---|---|---|---|
| 5,582,414 | 12/1996 | Miyazaki et al. | 277/444 |
| 5,743,536 | 4/1998 | Komuro et al. | 277/440 |
| 6,060,182 | 5/2000 | Tanaka et al. | 277/444 X |

FOREIGN PATENT DOCUMENTS

| | | |
|---|---|---|
| 6-248425 | 9/1994 | Japan . |
| 6-265023 | 9/1994 | Japan . |
| 6-293954 | 10/1994 | Japan . |

*Primary Examiner*—Anthony Knight
*Assistant Examiner*—Karlena D. Schwing
*Attorney, Agent, or Firm*—Armstrong, Westerman, Hattori, McLeland & Naughton

[57] ABSTRACT

A gas nitrided layer is formed over the entire surface of a piston ring. A physical vapor deposition film of CrN is formed over the gas nitrided layer at the outer circumferential surface. The physical vapor deposition film has oxygen contained in a solid solution state in a crystal structure of CrN in a content of 0.5 to 20 percent by weight, pores dispersed at a rate of 1 to 15 percent within the film and a crystal structure of CrN with a preferred orientation (200) parallel to the surface being covered. The Vicker's hardness of the film is within a range of 1000 to 1800. The physical vapor deposition film of CrN can be formed beneath a wear resistant film covering the outer circumferential surface of the piston ring. The wear resistant film is for instance, a physical vapor deposition film of chromium nitride such as CrN or $Cr_2N$.

20 Claims, 2 Drawing Sheets

SLIDING MEMBER

BACKGROUND OF THE INVENTION

1. Technical Field of the Invention

The present invention relates to a sliding member, for instance a piston ring or a valve driving member such as roller tappet shaft for internal combustion engines, or a vane for rotary compressors, covered with a physical vapor deposition film of CrN.

2. Description of the Related Art

The technology of the conventional art is disclosed as related below, for improvement of a physical vapor deposition film of CrN for covering the surfaces of a sliding member.

1. Japanese Patent Laid-Open No. 6-248425

A film with a thickness of 1 to 80 micrometers and comprised of CrN having a porosity of 1.5 to 20 percent is formed on the outer circumferential surface of the piston ring, thereby peeling in the film caused by pitting fatigue is suppressed. The film is characterized in having; a columnar crystal structure formed in the direction of the film thickness, a preferred orientation (111) parallel to the outer circumferential surface, a film formed by an ion plating method, and a Vicker's hardness of 600 to 1000.

The preferred orientation (111) is also described as an important factor in Japanese Patent Laid-Open No. 6-293954.

2. Japanese Patent Laid-Open No. 6-265023

Toughness and scuffing resistance of the film can be improved by containing oxygen in 3 to 20 percent by weight in a solid solution state in a crystal structure of CrN. The film has a Vicker's hardness of 1600 to 2200.

In the aforementioned technology of the conventional art, there is no mention of superior resistance to cracks in the physical vapor deposition film of CrN with a preferred orientation (200) parallel to the surface being covered; and there is absolutely nothing to suggest that a film having the specified porosity and preferred orientation (200) has superior resistance to cracks.

SUMMARY OF THE INVENTION

It is an object of the present invention to provide a sliding member covered with a physical vapor deposition film of CrN having improved crack resistance and peeling resistance for use under harsh operating conditions and having superior durability.

The sliding member covered on the sliding surfaces with the physical vapor deposition film of CrN is characterized in having oxygen contained in a solid solution state in a crystal structure of the CrN in a content of 0.5 to 20 percent by weight, pores dispersed at a rate of 1 to 15 percent in the film, and a crystal structure of CrN with a preferred orientation (200) parallel to the surface being covered.

The physical vapor deposition film has preferably a Vicker's hardness of 1000 or more and a Vicker's hardness of 1800 or less and has more preferably 1600 or less. The wear resistance declines when the Vicker's hardness is less than 1000. The wear of the mating member increases when the Vicker's hardness is greater than 1800.

The porosity affects the hardness and the crack load. When porosity is less than one percent, there is no crack suppression effect. When porosity exceeds 15 percent, the problems of hardness declining and wear resistance declining occur. A porosity of 3 to 15 percent and the film hardness within a Vicker's hardness range of 1000 to 1600 are more preferable.

The oxygen contained in a solid solution state affects the scuffing resistance and the toughness of the film. An improved effect for film toughness and scuffing resistance cannot be obtained, when the content of oxygen contained in a solid solution state falls below 0.5 percent by weight. When the content of oxygen contained in a solid solution state exceeds 20 percent by weight, the chromium oxides deposit and film toughness declines. The content of oxygen contained in a solid solution state is therefore preferably 2 to 15 percent by weight.

The crystal structure of CrN has preferably a preferred orientation (200). The film having a crystal structure of CrN with a preferred orientation of (111), (311), or (220) is brittle in comparison with the film with the preferred orientation (200).

The thickness of the physical vapor deposition film is preferably within a range of 1 to 120 micrometers.

Besides forming a physical vapor deposition film on the outermost surface of the sliding member, the resistance to peeling can be improved by forming the physical vapor deposition film beneath a wear resistant film, for instance a physical vapor deposition film of chromium nitride such as CrN or $Cr_2N$.

The physical vapor deposition film of CrN of the present invention may contain, within a range where the effect of the invention is not lost, Cr phase and/or $Cr_2N$ phase of microparticles that is formed unavoidably in the physical vapor deposition process.

The sliding member may for instance be a structural component of an internal combustion engine such as a piston ring or a valve driving member, or may be a vane of a rotary compressor.

BRIEF DESCRIPTION OF THE DRAWINGS

The aforesaid and other objects and features of the present invention will become more apparent from the following description of the preferred embodiments of the present invention with reference to the accompanying drawings, wherein.

DESCRIPTION OF THE PREFERRED EMBODIMENTS

Figure 1:
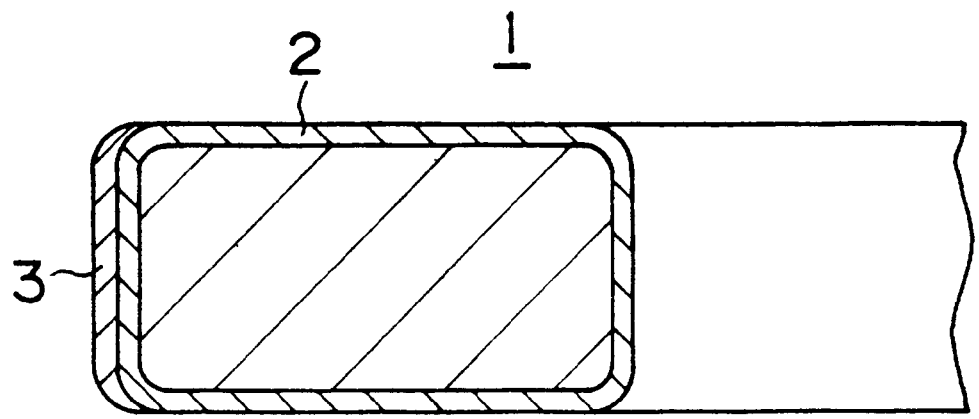
FIGS. 1(a) and 1(b) are respectively longitudinal cross sectional views showing a portion of the piston ring of the preferred embodiments of the present invention.
Figure 1:
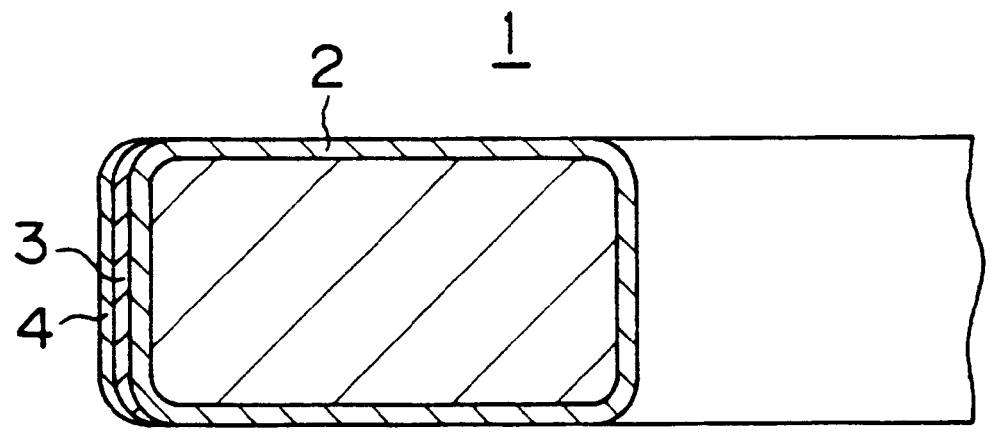

Hereafter, the preferred embodiments of the present invention are described while referring to FIG. 1(a) and FIG. 1(b).

In FIG. 1(a), a gas nitrided layer 2 with a thickness of 20 to 90 micrometers is formed over the entire surface of a piston ring 1. A physical vapor deposition film 3 of CrN with a thickness of 1 to 120 micrometers is formed over the gas nitrided layer 2 at the outer circumferential surface. The physical vapor deposition film 3 of CrN has oxygen contained in a solid solution state in a crystal structure of CrN in a content of 0.5 to 20 percent by weight. Pores are dispersed at a rate of 1 to 15 percent within the film. The crystal structure of CrN has a preferred orientation (200) parallel to the surface being covered. The Vicker's hardness of the film is within a range of 1000 to 1800.

FIG. 1(b) shows another example, in which the above-mentioned physical vapor deposition film of CrN is formed beneath a wear resistant film in order to improve the resistance to peeling of the wear resistant film. In other words, a gas nitrided layer 2 with a thickness of 20 to 90 micrometers is formed over the entire surface of the piston ring 1. The physical vapor deposition film 3 of CrN with a thickness of 1 to 50 micrometers is formed over the gas nitrided layer 2 at the outer circumferential surface. A wear resistant film 4 which is for instance, a physical vapor deposition film of chromium nitride such as CrN or $Cr_2N$ is further formed above the physical vapor deposition film 3 in a thickness of 1 to 90 micrometers.

The physical vapor deposition film of CrN with oxygen contained in a solid solution state can be covered by means of an ion plating method which uses metallic chromium as the evaporation source and uses nitrogen gas and oxygen gas as process gases. The bias voltage is reduced and the process gas pressure is increased, when the pores are dispersed in the physical vapor deposition film. The preferred orientation of the crystal structure of CrN deposited in the physical vapor deposition process may undergo complex fluctuations due to factors such as the process gas and the bias voltage. On using an arc ion plating apparatus, the inventors found that the preferred orientation can be most easily controlled by means of the partial pressure of oxygen in the process gases and the bias voltage. Table 1 shows the preferred orientations of the crystal structure of CrN deposited under various conditions.

TABLE 1

| Partial pressure ratio of oxygen gas | Bias voltage (V) | | | | |
|---|---|---|---|---|---|
| | −5 | −10 | −50 | −100 | −150 |
| 0 | (200) | (111) | (111) | — | — |
| 0.04 | (200) | (200) | (311) | — | — |
| 0.08 | (200) | (200) | No presence of preferred orientation | (220) | (220) |

Note:
Total pressure was set at 1.33Pa.

The characteristics of the various physical vapor deposition films of CrN fabricated by using the arc ion plating apparatus, as well as the results from measuring the crack load by means of the pin-on-cylinder friction testing machine are described next.

The crystal structure as well as the preferred orientation of the film were determined by means of X-ray diffraction patterns recorded by an X-ray diffractometer. Further, the porosity, after rapping of the surface, was measured by means of an image analysis device. The analysis of oxygen content was performed by means of an X-ray micro analyzer.

The crystal structure, content of oxygen contained in a solid solution state, porosity and preferred orientation of the film as well as the characteristics of the film hardness and crack loads are shown in Table 2.

Figure 2A:
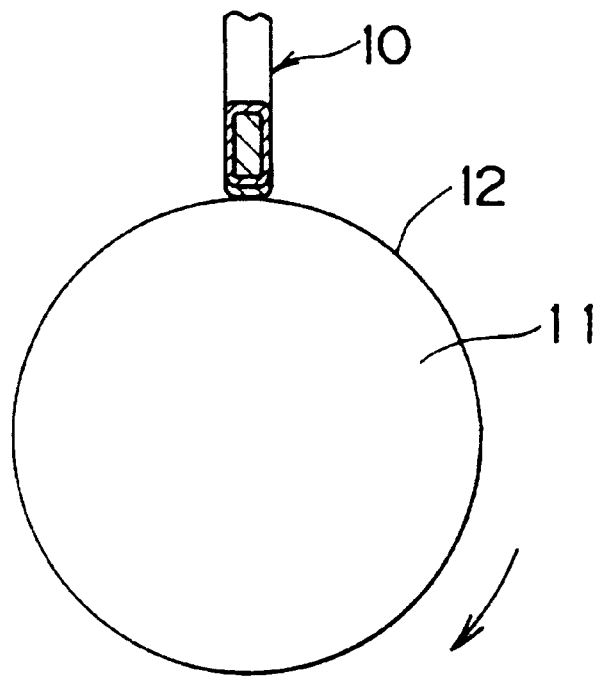
FIG. 2(a) is a front elevational view partly in section showing a pin-on-cylinder friction testing machine.
Figure 2B:
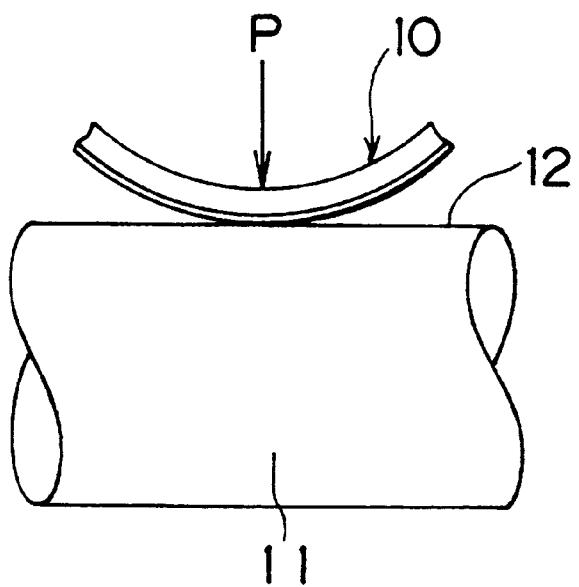
FIG. 2(b) is a side elevational view of the testing machine of FIG. 2(a).

The pin-on-cylinder friction testing machine used in the measurement of the crack load is shown in FIG. 2. The piston ring used as test piece 10 was mounted on the top edge of the outer circumferential surface 12 of a rotor 11 rotated around the horizontal axis. A load P was applied to the piston ring used as test piece 10, pressing the piston ring against the outer circumferential surface 12 of the rotor 11. The rotor 11 was rotated in this state, while lubricating oil was supplied to the contact portion between the rotor 11 and the piston ring used as test piece 10. After operation for specified times under various loads, the sliding surface was observed for the presence or absence of cracks by microscope.

The test conditions were as follows.
(1) Test piece (piston ring)
  Material : 17% Cr martensitic steel
  Under layer processing : Nitriding
  Film thickness : 50 micrometers
  Surface roughness : 0.6 micrometers Rz
(2) Rotor
  Material : Cast iron (JIS FC250 equivalent)
  Surface : Mirror finish
(3) Lubricating oil : Nisseki Hi-Diesel S3 10W engine oil
(4) Load: Range of 30 to 150N
  Initially the load was 30N for 1 minute and if no cracks occurred, the load was further increased in steps of 10N until cracks occurred or until a load of 150N.
(5) Time: One minute at each load
(6) Speed: 3 meters per second
(7) Temperature: Room temperature The test results are shown in Table 2. The comparative examples 1 and 2 in Table 2 are respectively the films in Japanese Patent Laid-Open No. 6-248425 and in Japanese Patent Laid-Open No. 6-265023 described in the Related Art. The film of comparative example 3 is a further improvement on the film of comparative example 2, and the oxygen content of the physical vapor deposition film containing oxygen in a solid solution state in a crystal structure of CrN was increased from the base material side towards the surface side. The crack load for these comparative examples was within 120N. The comparative examples 4, 5 and 6 had oxygen contents in a solid solution state which were outside the specified range and the crack load for comparative examples 4, 5 and 6 was within 50N. The comparative examples 7 and 8 had porosity outside the specified range and a crack load of 100N. The comparative example 9 was outside of the preferred orientation (200) and the crack load was 100N.

In contrast, the embodiments 1, 2, 3, 4, 5 and 6 had crack loads of 130N or more. Results showed that the embodiments 1, 2, and 3 in particular had crack loads greater than 150N.

TABLE 2

| No. | Crystal structure | Oxygen content in a solid solution state (wt. %) | Porosity (%) | Preferred orientation | Vicker's hardness (HV) | Crack load (N) |
|---|---|---|---|---|---|---|
| Embodiment | | | | | | |
| 1 | CrN | 0.6 | 15 | (200) | 1000 | Greater than 150 |
| 2 | CrN | 7 | 3 | (200) | 1380 | Greater than 150 |
| 3 | CrN | 10 | 8 | (200) | 1320 | Greater than 150 |
| 4 | CrN | 20 | 1 | (200) | 1600 | 140 |
| 5 | CrN | 8 | 11 | (200) | 1800 | 130 |
| 6 | Upper layer CrN | 5 | 12 | (311) | 1580 | 130 |
|   | Under layer CrN | 8 | 10 | (200) | 1300 | |

TABLE 2-continued

| No. | Crystal structure | Oxygen content in a solid solution state (wt. %) | Porosity (%) | Preferred orientation | Vicker's hardness (HV) | Crack load (N) |
|---|---|---|---|---|---|---|
| Comparative Example | | | | | | |
| 1 | CrN | 0 | 15 | (111) | 900 | 30 |
| 2 | CrN | 12 | 0.5 | None | 1900 | 100 |
| 3 | CrN | 4 →18 | 0.5 | None | 1550 →2100 | 120 |
| 4 | CrN | 0 | 14 | (200) | 1100 | 30 |
| 5 | CrN | 0.4 | 15 | (200) | 1020 | 50 |
| 6 | CrN + Cr$_2$O$_3$ | 20.2 | 5 | (200) | 1590 | 30 |
| 7 | CrN | 18 | 0.8 | (200) | 1450 | 100 |
| 8 | CrN | 3 | 16 | (200) | 1000 | 100 |
| 9 | CrN | 4 | 15 | (220) | 1590 | 100 |

Note:
The arrow symbols in the Table 2 indicate that hardness and oxygen content in a solid solution state change from the base material side towards the surface side.

The results of the engine tests are described next.

Engine tests were performed using the film of comparative example 3 having the highest crack load from among the comparative examples in the above mentioned test, and the films of the embodiments 1, 2, and 3, which were applied to the outer circumferential surface of the top ring. A four cylinder, 4 stroke diesel engine with a cylinder bore of 94 mm in diameter was used. After the engine was operated under a full load conditions for 300 hours, the outer circumferential surface of the top ring were examined. The results are shown in Table 3. There were no cracks or peeling in the embodiments 1 through 3 as can be seen in Table 3.

TABLE 3

| | No. | Physical vapor deposition film status on outer circumferential surface of top ring |
|---|---|---|
| Embodiment | 1 | No cracks or peeling |
| | 2 | No cracks or peeling |
| | 3 | No cracks or peeling |
| Comparative Example | 3 | Cracks and peeling found |

Although the present invention has been described with reference to the preferred embodiments, it is apparent that the present invention is not limited to the aforesaid preferred embodiments, but various modifications can be attained without departing from its scope.

What is claimed is:

1. A sliding member comprising a physical vapor deposition film of CrN covered on a sliding surface of said sliding member, said physical vapor deposition film having oxygen contained in a solid solution state in a crystal structure of CrN in a content of 0.5 to 20 percent by weight, pores dispersed at a rate of 1 to 15 percent within the film, and a crystal structure of CrN with a preferred orientation (200) parallel to a surface being covered.

2. A sliding member as claimed in claim 1, wherein said physical vapor deposition film has a Vicker's hardness within a range of 1000 to 1800.

3. A sliding member as claimed in claim 2, wherein said physical vapor deposition film has a thickness within a range of 1 to 120 micrometers.

4. A sliding member as claimed in claim 2, wherein said sliding member is a piston ring.

5. A sliding member as claimed in claim 1, wherein said sliding member is a piston ring.

6. A sliding member as claimed in claim 1, wherein said physical vapor deposition film has a Vicker's hardness within a range of 1000 to 1600.

7. A sliding member as claimed in claim 6, wherein said physical vapor deposition film has a thickness within a range of 1 to 120 micrometers.

8. A sliding member as claimed in claim 6, wherein said sliding member is a piston ring.

9. A sliding member comprising a physical vapor deposition film of CrN formed underneath a wear resistant film covering a sliding surface of said sliding member, said physical vapor deposition film having oxygen contained in a solid solution state in a crystal structure of CrN in a content of 0.5 to 20 percent by weight, pores dispersed at a rate of 1 to 15 percent within the film, and a crystal structure of CrN with a preferred orientation (200) parallel to a surface being covered.

10. A sliding member as claimed in claim 9, wherein said physical vapor deposition film has a Vicker's hardness within a range of 1000 to 1800.

11. A sliding member as claimed in claim 10, wherein said wear resistant film is a physical vapor deposition film.

12. A sliding member as claimed in claim 10, wherein said wear resistant film is a physical vapor deposition film of chromium nitride.

13. A sliding member as claimed in claim 10, wherein said sliding member is a piston ring.

14. A sliding member as claimed in claim 9, wherein said physical vapor deposition film has a Vicker's hardness within a range of 1000 to 1600.

15. A sliding member as claimed in claim 14, wherein said wear resistant film is a physical vapor deposition film.

16. A sliding member as claimed in claim 14, wherein said wear resistant film is a physical vapor deposition film of chromium nitride.

17. A sliding member as claimed in claim 14, wherein said sliding member is a piston ring.

18. A sliding member as claimed in claim 9, wherein said wear resistant film is a physical vapor deposition film.

19. A sliding member as claimed in claim 9, wherein said wear resistant film is a physical vapor deposition film of chromium nitride.

20. A sliding member as claimed in claim 9, wherein said sliding member is a piston ring.

* * * * *

UNITED STATES PATENT AND TRADEMARK OFFICE
CERTIFICATE OF CORRECTION

PATENT NO. : 6,149,162
DATED : November 21, 2000
INVENTOR(S) : Shoji Tanaka et al.

It is certified that error appears in the above-identified patent and that said Letters Patent is hereby corrected as shown below:

Title Page:

Item: [73] please change the Assignee information from

Assignee: "Teikoku Pistong Ring Co., Ltd., Tokyo, Japan" to
Assignee: -- Teikoku Piston Ring Co., Ltd., Tokyo, JAPAN --

Signed and Sealed this

Seventh Day of August, 2001

*Attest:*

NICHOLAS P. GODICI
*Attesting Officer*    *Acting Director of the United States Patent and Trademark Office*